(12) United States Patent
Lee (10) Patent No.: US 6,965,539 B2
(45) Date of Patent: Nov. 15, 2005

(54) WRITE PATH SCHEME IN SYNCHRONOUS DRAM

(75) Inventor: Sang Hee Lee, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 130 days.

(21) Appl. No.: 10/741,059

(22) Filed: Dec. 19, 2003

(65) Prior Publication Data

US 2005/0047264 A1    Mar. 3, 2005

(30) Foreign Application Priority Data

Aug. 25, 2003 (KR) ................ 10-2003-0058627

(51) Int. Cl.[7] ................................ G11C 8/00
(52) U.S. Cl. ............ 365/233; 365/205; 365/189.02; 365/230.06
(58) Field of Search .............. 365/233, 189.02, 365/205, 230.06

(56) References Cited

U.S. PATENT DOCUMENTS

| | | | |
|---|---|---|---|
| 5,498,990 A | 3/1996 | Leung et al. | |
| 5,737,587 A | 4/1998 | Leung et al. | |
| 6,205,071 B1 * | 3/2001 | Ooishi | 365/230.06 |
| 6,351,423 B2 * | 2/2002 | Ooishi | 365/230.06 |
| 6,646,946 B2 * | 11/2003 | Tomishima et al. | 365/230.03 |

FOREIGN PATENT DOCUMENTS

| | | |
|---|---|---|
| JP | 9063263 | 3/1997 |
| JP | 2002025255 | 1/2002 |

* cited by examiner

*Primary Examiner*—Anh Phung
*Assistant Examiner*—Tuan T. Nguyen
(74) *Attorney, Agent, or Firm*—Marshall, Gerstein & Borun LLP (57) ABSTRACT

A write path scheme in a synchronous DRAM having: a data converter unit to convert serial input data to parallel output data, a multiplexer to output data from the data converter unit depending on a first mode selection signal and a second mode selection signal, and a data input/output sense amplifier having a plurality of sense amplifiers to separately operate the plurality of sense amplifiers depending on the first mode selection signal and the second mode selection signal to sense data from the multiplexer and then load the data on a global input/output line. Also included is a write driver to load data from the global input/output line on a local input/output line.

9 Claims, 8 Drawing Sheets

| IDD4W | | tvdd1 | tvcore | tvpp | tvbb | tvblkp | tvcp | tvdd1l | tvddq | tvdd1 | tvddfi1 | tvdd12 | DLC | TOTAL |
|---|---|---|---|---|---|---|---|---|---|---|---|---|---|---|
| | FF | 128.860 | 7.337 | 0.011 | 0.019 | 0.003 | 0.045 | 9.683 | 0.055 | 0.632 | 0.188 | 2.579 | 10.600 | 153.214 |
| | TT | 110.340 | 6.739 | 0.122 | 0.062 | 0.007 | 0.045 | 5.507 | 0.012 | 0.543 | 0.189 | 2.231 | 8.900 | 128.772 |
| | SS | 96.660 | 6.148 | 0.049 | 0.115 | 0.010 | 0.161 | 2.884 | 0.006 | 0.479 | 0.194 | 1.994 | 8.340 | 111.706 |

FIG. 6B

| IDD4W | | tvdd1 | tvcore | tvpp | tvbb | tvblkp | tvcp | tvdd1l | tvddq | tvdd1 | tvddfi1 | tvdd12 | DLC | TOTAL |
|---|---|---|---|---|---|---|---|---|---|---|---|---|---|---|
| | FF | 93.526 | 7.330 | 0.037 | 0.062 | 0.003 | 0.045 | 9.683 | 0.012 | 0.633 | 0.189 | 2.577 | 10.600 | 117.900 |
| | TT | 80.922 | 6.744 | 0.481 | 0.191 | 0.007 | 0.045 | 5.507 | 0.025 | 0.542 | 0.189 | 2.229 | 8.900 | 99.882 |
| | SS | 71.728 | 6.153 | 0.176 | 0.348 | 0.010 | 0.161 | 2.884 | 0.009 | 0.480 | 0.194 | 1.996 | 8.340 | 87.140 |

FIG. 7

WRITE PATH SCHEME IN SYNCHRONOUS DRAM

BACKGROUND

1. Technical Field of the Invention

The present patent relates to a write path scheme in a synchronous dynamic random access memory (DRAM) and, more particularly, to a write path scheme in a DDR II SDRAM.

2. Discussion of Related Art

As a DDR I SDRAM has been replaced with a DDR II SDRAM, new regulations for write latency have been applied in order to increase efficiency of buses. According to the new regulations, column operations are defined on two-clock basis, and specification for interrupt operations is defined not to be stringent.

Figure 1:
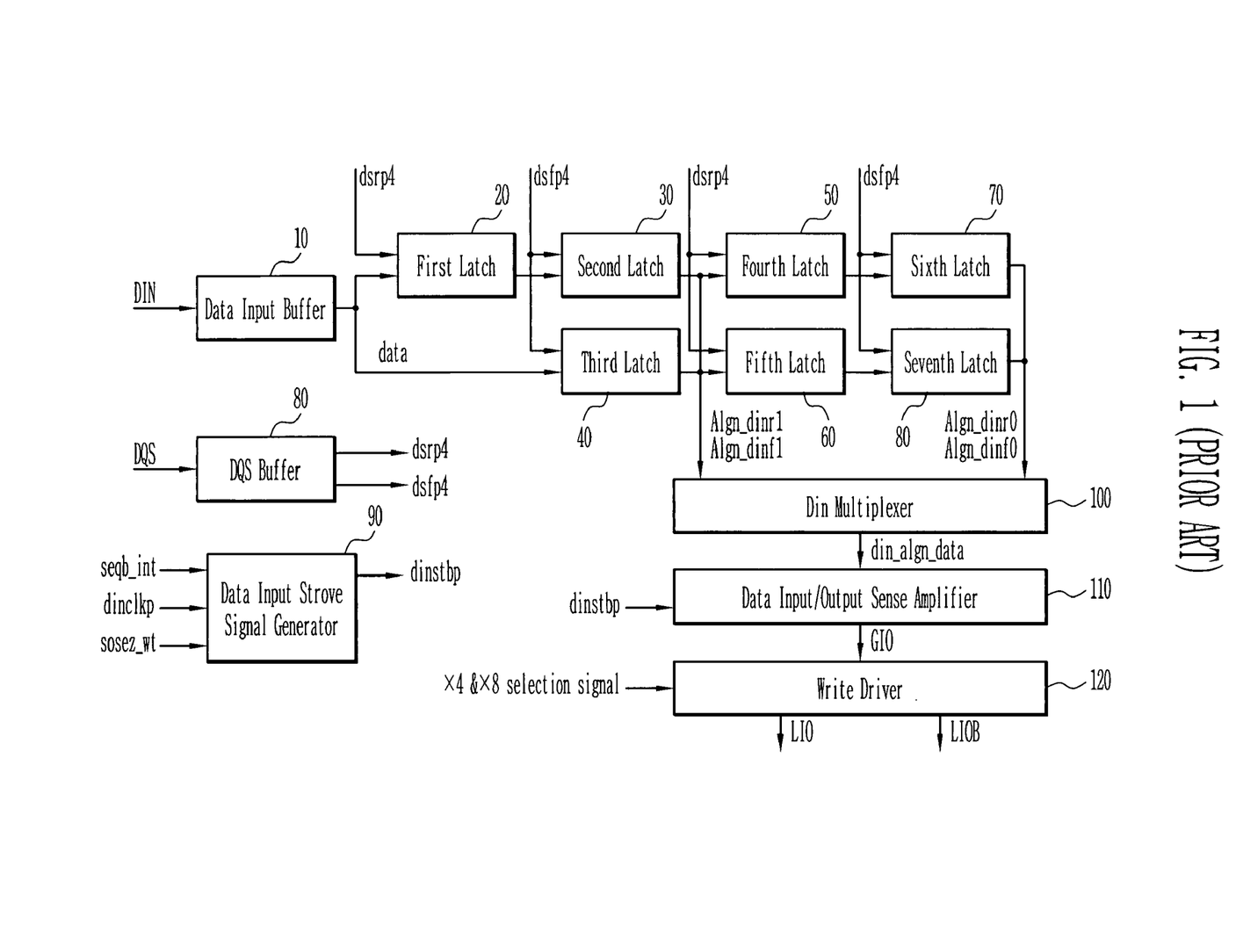
FIG. 1 is a block diagram showing a conventional write path scheme.

FIG. 1 is a block diagram showing a conventional write path scheme. Referring to FIG. 1 input data DIN are input to a data input buffer 10 in a serial manner. Such serial input data are latched in a data converter unit which includes first to seventh latches 20 to 80 depending on the rising and the falling edge signals dsrp4 and dsfp4 of a data strobe signal DQS from a DQS buffer 80. Then, four-by-four aligned data (i.e., Algn_dinr0, Algn_dinf0, and Algn_dinr1, Algn_dinf1) are simultaneously input to a Din multiplexer 100 in a parallel manner depending on the rising and the falling edge signals dsrp4 and dsfp4 of the data strobe signal DQS. The Din multiplexer 100 outputs 16, 32, or 64 data din_algn_data to a data input/output sense amplifier 110 depending on X4, X8, or X16 mode. The data input/output sense amplifier 110 is constructed with 64 sense amplifiers, which outputs the data sensed in the data input/output sense amplifier 110 through 64 global input/output lines GIO to a write driver 120 depending on a control signal dinstbp generated from a data input strobe signal generator 90.

The write driver 120 is separately operated depending on X4 and X8 mode selection signals to load input data on local input/output lines LIO and LIOB.

For the conventional write path scheme described above, 64 sense amplifiers in the data input/output sense amplifier unit are arranged to be operated irrespective of X4, X8, or X16 mode, so that 64 global input/output lines are toggled. As a result, since the global input/output lines, which are not used in the X4 or X8 mode, are also toggled, there is a problem with how much power consumption is needed.

SUMMARY

Accordingly, the disclosed embodiments are directed to provide a write path scheme in a synchronous DRAM capable of remedying the above shortcomings.

A second aspect is directed to reduce the power consumption by separately operating the data input/output sense amplifier depending on the mode selection signals.

Accordingly, a write path scheme in a synchronous DRAM includes a data converter unit for converting serial input data to parallel output data; a multiplexer for outputting data from the data converter unit depending on a first mode selection signal and a second mode selection signal; a data input/output sense amplifier, having a plurality of sense amplifiers, for separately operating the plurality of sense amplifiers depending on the first mode selection signal and the second mode selection signal to sense data from the multiplexer and then load the data on a global input/output line; and a write driver for loading data from the global input/output line on a local input/output line.

BRIEF DESCRIPTION OF THE DRAWINGS

The aforementioned aspects and other features of the disclosed embodiments will be explained in the following description, taken in conjunction with the accompanying drawings, wherein.

DETAILED DESCRIPTION OF PREFERRED EMBODIMENTS

The disclosed embodiments will be described in detail with reference to the accompanying drawings, in which like reference numerals are used to identify the same or similar parts.

The data input/output sense amplifier of FIG. 1 is adapted to separately operate depending on the mode selection signal in a write path structure. Because other parts are similar to those of the conventional art, the following description will be related with only the data input/output sense amplifier.

Figure 2:
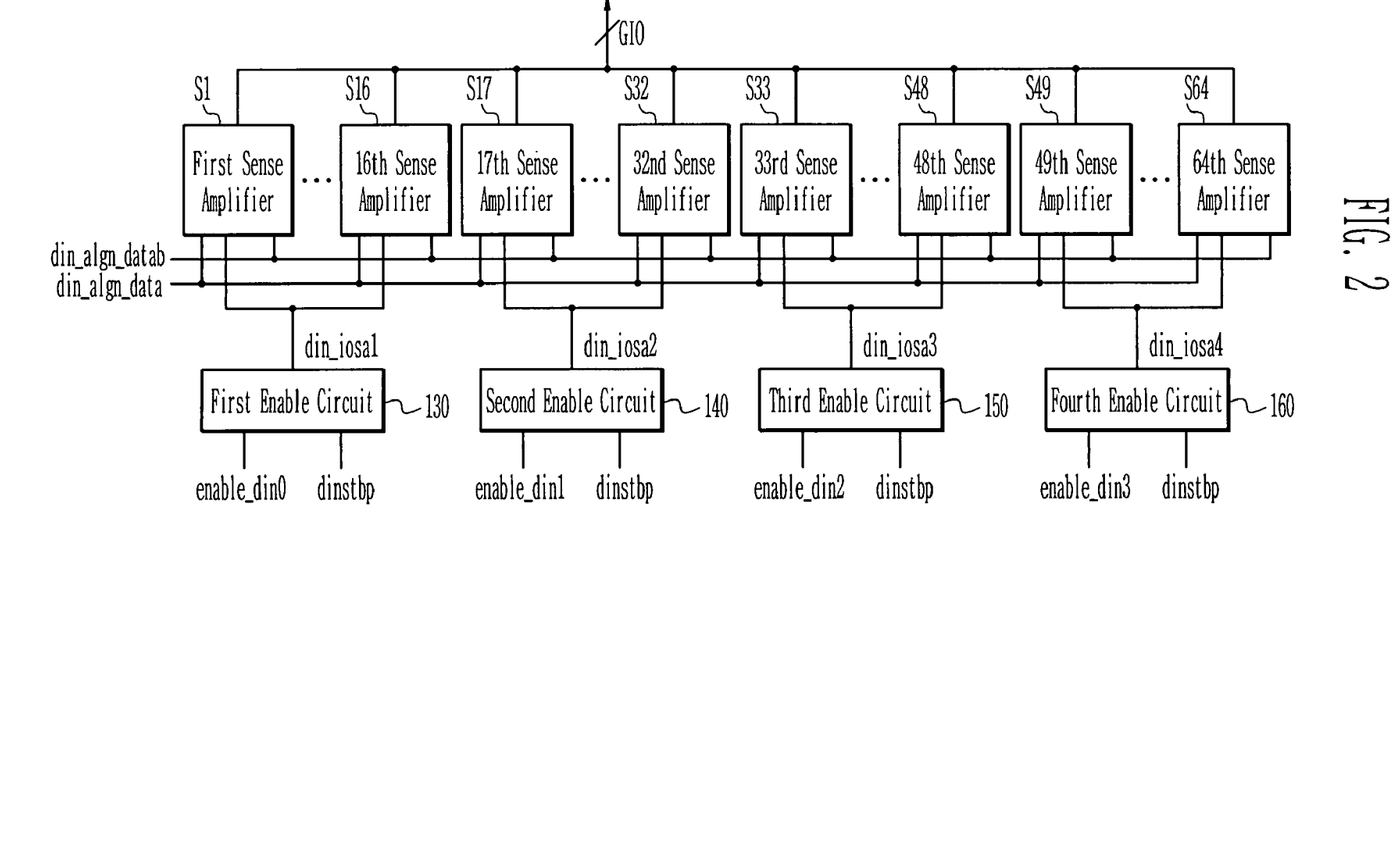
FIG. 2 is a block diagram showing an exemplary embodiment of a data input/output sense amplifier according to the present invention.

FIG. 2 is a block diagram showing an embodiment of an exemplary data input/output sense amplifier.

Typically, the data input/output sense amplifier comprises 64 sense amplifiers S1 to S64. The data din_algn_data from the Din multiplexer 100 are input to each of the sense amplifiers S1 to S64, and the corresponding inverted data din_algn_datab are input to each of the sense amplifier S1 to S64.

The 1st to 64th amplifiers S1 to S64 can be classified into 4 blocks.

The 1st to 16th sense amplifiers S1 to S16 come to be in an enable state depending on the output din_iosa1 from the first enable circuit 130. The 17th to 32nd sense amplifiers S17 to S32 come to be in an enable state depending on the output din_iosa2 from the second enable circuit 140. The 33rd to 48th sense amplifiers S33 to S48 come to be in an enable state depending on the output din_iosa3 from the third enable circuit 150. The 49th to 64th sense amplifiers S49 to S64 come to be in an enable state depending on the output din_iosa4 from the fourth enable circuit 160.

Each output of the 1st to 4th enable circuits 130 to 160 is generated depending on the control signals (i.e., dinstb, enable_din0, enable_din1, enable_din2, and enable_din3). How to generate the control signals (enable_din0, enable_din1, enable_din2, and enable_din3) will be described with reference to FIGS. 3A and 3B.

Figure 3A:
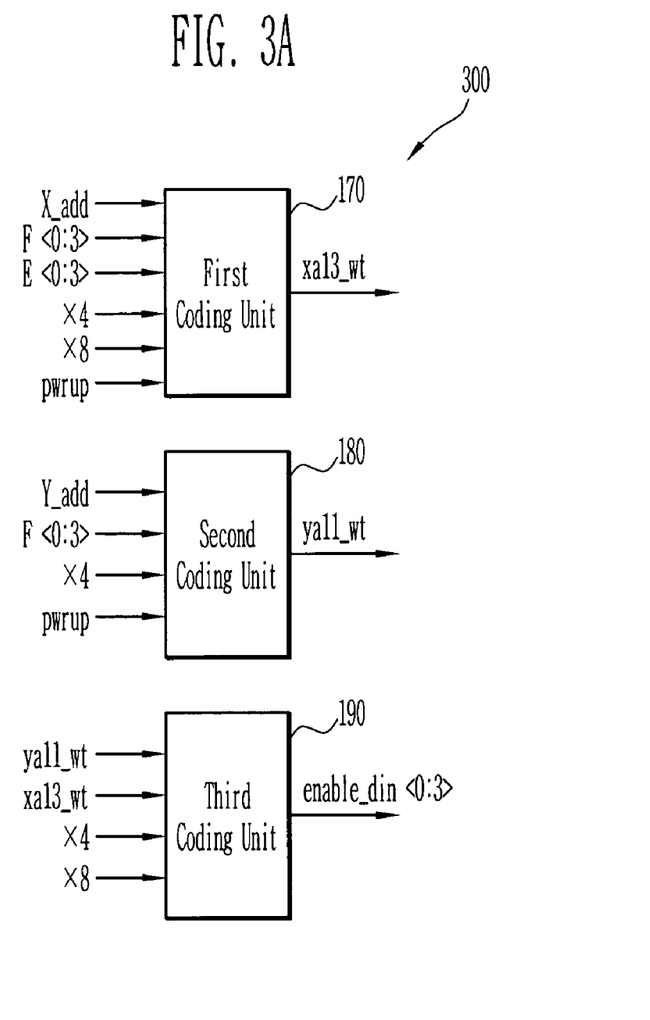
FIGS. 3A and 3B are detailed circuit diagrams showing the first to fourth enable circuits shown in FIG. 2.

The coding unit 300 in FIG. 3A includes first to third coding units 170 to 190.

The first coding unit 170 generates the coding signal xa13_wt based on the row address x_add<13>, the control signals F<0:3> and E<0:3>, the mode selection signals X4 and X8, and the power-up signal pwrup.

The second coding unit 180 generates the coding signal ya11_wt based on the column address y_add<11>, the control signal F<0:3>, the mode selection signal X4, and the power-up signal pwrup.

The third coding unit 190 generates the control signal enable_din<0:3> based on the output ya11_wt of the second coding unit 180, the output xa13_wt of the first coding unit 170, and the mode selection signals X4 and X8.

Figure 3B:
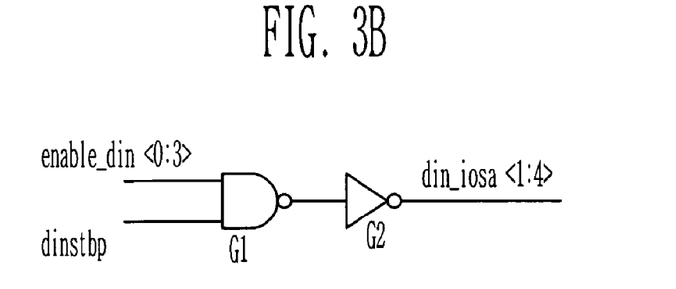

FIG. 3B is a detailed circuit diagram showing first to fourth enable circuits 130 to 160 shown in FIG. 2. The output enable_din<0:3> of the third coding unit 190 and the output dinstb of the data input strobe signal generator in FIG. 1 are input to the NAND gate G1. The output of the NAND gate G1 is inverted by the inverter G2 to generate the control signals din_iosa1, din_iosa2, din_iosa13, and ding_iosa4.

For reference, the control signal E<0:3> is created by a logical AND operation of a bank addresses and pulses generated at an active state.

If a bank<0> is in active state, E<0> comes to be at a high level, and E<1>, E<2>, and E<3> comes to be at a low level. If a bank<1> is in an active state, E<1> comes to be at a high level, and E<0>, E<2>, and E<3> come to be at a low level. If a bank<2> is in an active state, E<2> comes to be at a high level, and E<0>, E<1>, and E<3> come to be at a low level. If a bank<3> is in an active state, E<3> comes to be at a high level, and E<0>, E<1>, and E<2> come to be at a low level.

In addition, the control signal F<0:3> is generated by a logical AND operation of a bank address and a signal activated when a write operation is performed.

If a write operation starts to be performed for a bank<0>, F<0> comes to be at a high level, and F<1>, F<2>, and F<3> come to be at a low level. If a write operation starts to be performed for a bank<1>, F<1> comes to be at a high level, and F<0>, F<2>, and F<3> come to be at a low level. If a write operation starts to be performed for a bank<2>, F<2> comes to be at a high level, and F<0>, F<1>, and F<3> come to be at a low level. If a write operation starts to be performed for a bank<3>, F<3> comes to be at a high level, and F<0>, F<1>, and F<2> come to be at a low level.

Figure 4A:
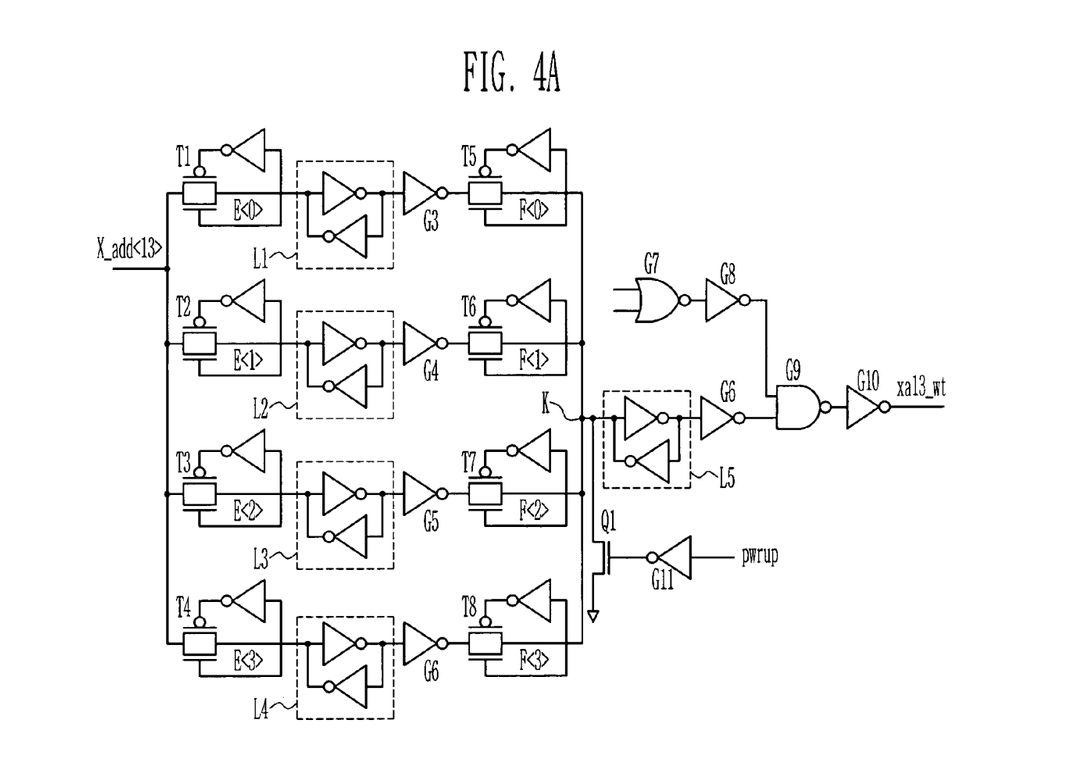
FIG. 4A is a detailed circuit diagram showing a first coding unit shown in FIG. 3A.

FIG. 4A is a detailed circuit diagram showing a first coding unit. The row address X_add<13> is latched in the latches L1 and L4 depending on operations of the transfer gates T1 to T4. The transfer gates T1 to T4 are turned on depending on the control signal E<0:3>. The outputs of the latches L1 to L4 are inverted by the inverters G3 to G6, respectively.

Each of the outputs of the inverter G3 to G6 is transferred to a node K depending on operations of the transfer gates T5 to T8 and then latched in the latch L5. The transfer gates T5 to T8 are turned on depending on the control signal F<0:3>.

The output of the latch L5 is inverted by the inverter G6. Then, a NOR operation is performed on the mode selection signals X4 and X8 by the NOR gate G7. The output of the NOR gate G7 is inverted by the inverter G8. A NAND operation is performed on the outputs of the inverters G6 and G8 by the NAND gate G9. The output of the NAND gate G9 is inverted by the inverter G10, thereby generating the coding signal xa13_wt. Meanwhile, the power-up signal pwr_up is used to set up an initial value.

Figure 4B:
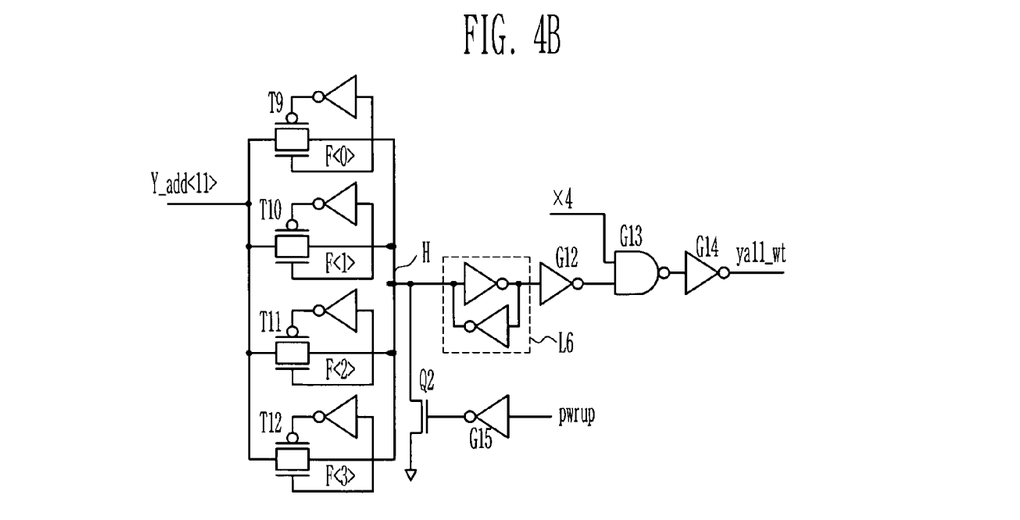
FIG. 4B: is a detailed circuit diagram showing a second coding unit shown in FIG. 3A.

FIG. 4B is a detailed circuit diagram of the second coding unit.

The column address Y_add<11> is transferred to a node H depending on operations of the transfer gates T9 to T12, and then latched in the latch L6. The transfer gates T9 to T12 are turned on depending on the control signal F<0:3>.

The output of the latch L6 is inverted by the inverter G12. A NAND operation is performed on the outputs of inverter 12 and the mode selection signal X4 by the NAND gate G13. The output of the NAND gate G13 is inverted by the inverter G14, thereby generating the code signal ya11_wt. Meanwhile, similarly to FIG. 4A, the power-up signal pwrup is used to set up an initial value.

Figure 4C:
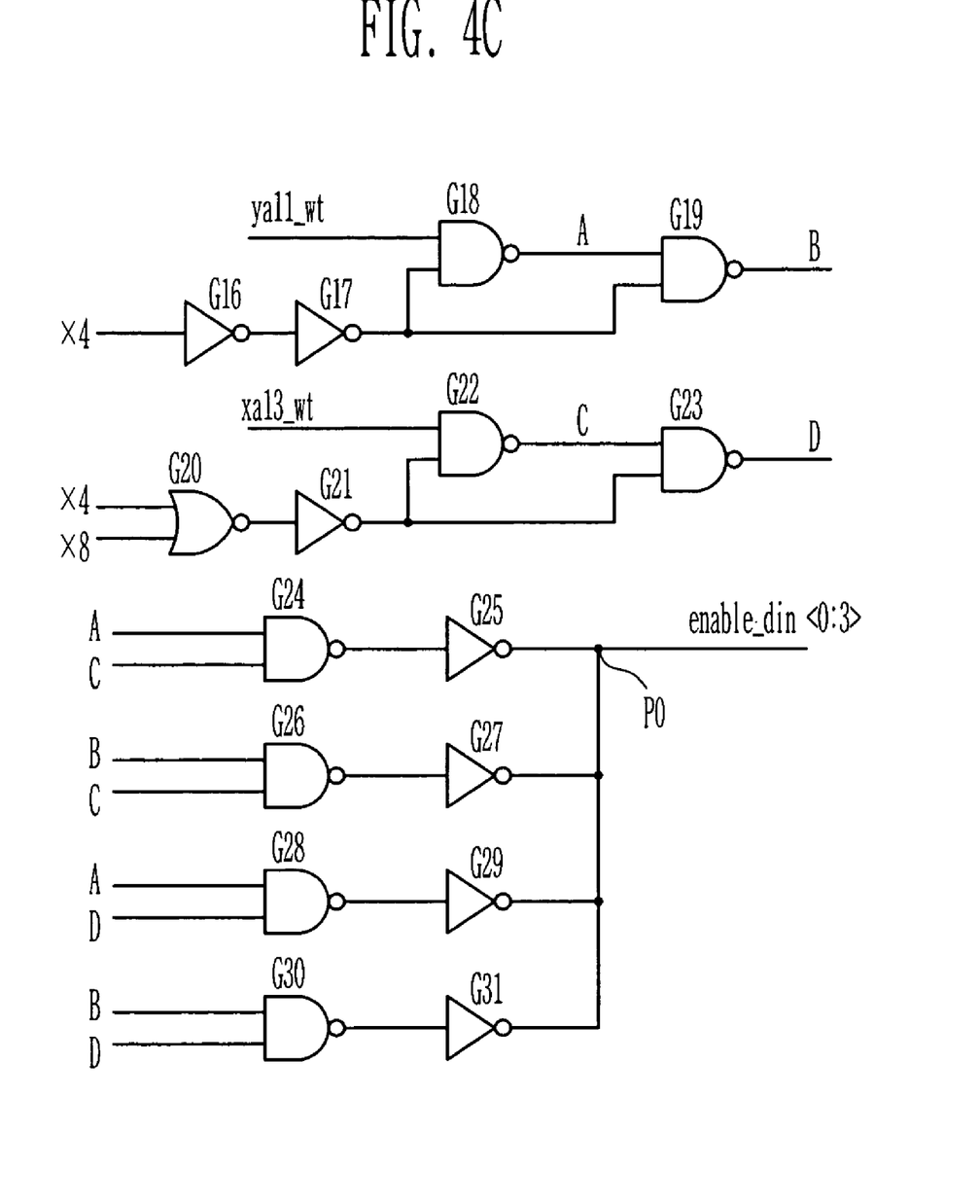
FIG. 4C is a detailed circuit diagram showing a third coding unit shown in FIG. 3A.

FIG. 4C is a detailed circuit diagram of the third coding unit. The mode selection signal X4 passes through the inverters G16 and G17 and then is input to the NAND gate 18. A NAND operation is performed on the output of the inverter G17 and the coding signal ya11_wt by the NAND gate G18, thereby generating an output A. A NAND operation is performed on the output of the NAND gate G18 and the output of the inverter G17 by the NAND gate G19, thereby generating an output B.

A NOR operation is performed on the mode selection signals X4 and X8 by the NOR gate G20, and then inverted by the inverter G21. A NAND operation is performed on the output of the inverter G21 and the coding signal xa13_wt, thereby generating an output C. A NAND operation is performed on the output C of the NAND gate G22 and the output of the inverter G21 by the NAND gate G23, thereby generating an output D.

A NAND operation is performed on the outputs A and C by the NAND gate G24, and then its output is transferred to a node P after passing through the inverter G25.

A NAND operation is performed on the outputs B and C by the NAND gate G26, and then its output is transferred to the node P after passing through the inverter G27. A NAND operation is performed on the outputs A and D by the NAND gate G28, and then its output is transferred to the node P after passing through the inverter G29. A NAND operation is performed on the outputs B and D by the NAND gate G30, and then its output is transferred to the node P after passing through the inverter G31. Finally, a control signal enable_din<0:3> is output from the node P.

The disclosed embodiments can be applied to a GC 512M DDR II SDRAM. In the first coding unit, a coding operation is performed by using the row address x_add<13> if the X8 mode is executed, and the row address x_add<13> and the column address y_add<11> if the X4 mode is executed. The control signal E<0:3> contains information of an active state and a bank address. The data of the row address x_add<13> is latched at the time that the control signal E<0:3> is activated if Bank0, Bank 3, Bank1, and Bank2 are in an active state, respectively. If the signal F<0:3>, which contains information of a bank address and information that a write operation has been accomplished, is in an enable state, the transfer gate is opened to generate the coding signal xa13_wt.

Since the signal F<0:3> also activates the column address y_add<11>, the column address y_add<11> has the same transfer timing for a coding as the row address x_add<13> has if the X4 mode is executed.

A control of the signal dinstb for a domain crossing is carried out depending on the signal enable_din<0:3> that is generated by a combination of the signals x_add<13> and y_add<11> resulted from the coding.

The domain crossing means the transition of the input data from a DQS domain to a clock domain. For a DDR, after the input data that are aligned with a DQS signal are input, they are internally transited to a clock domain. In other words, the data input/output sense amplifier starts to operate to load the input data on the inverter G10 when the control signal dinstb comes to be a high level.

Only the data input/output sense amplifier selected by the coding of the row address x_add<13> and the column address y_add<11> can operate in an X4 mode, whereas only the data input/output sense amplifier selected by the row address xy_add<13> can operate in an X8 mode.

Figure 5:
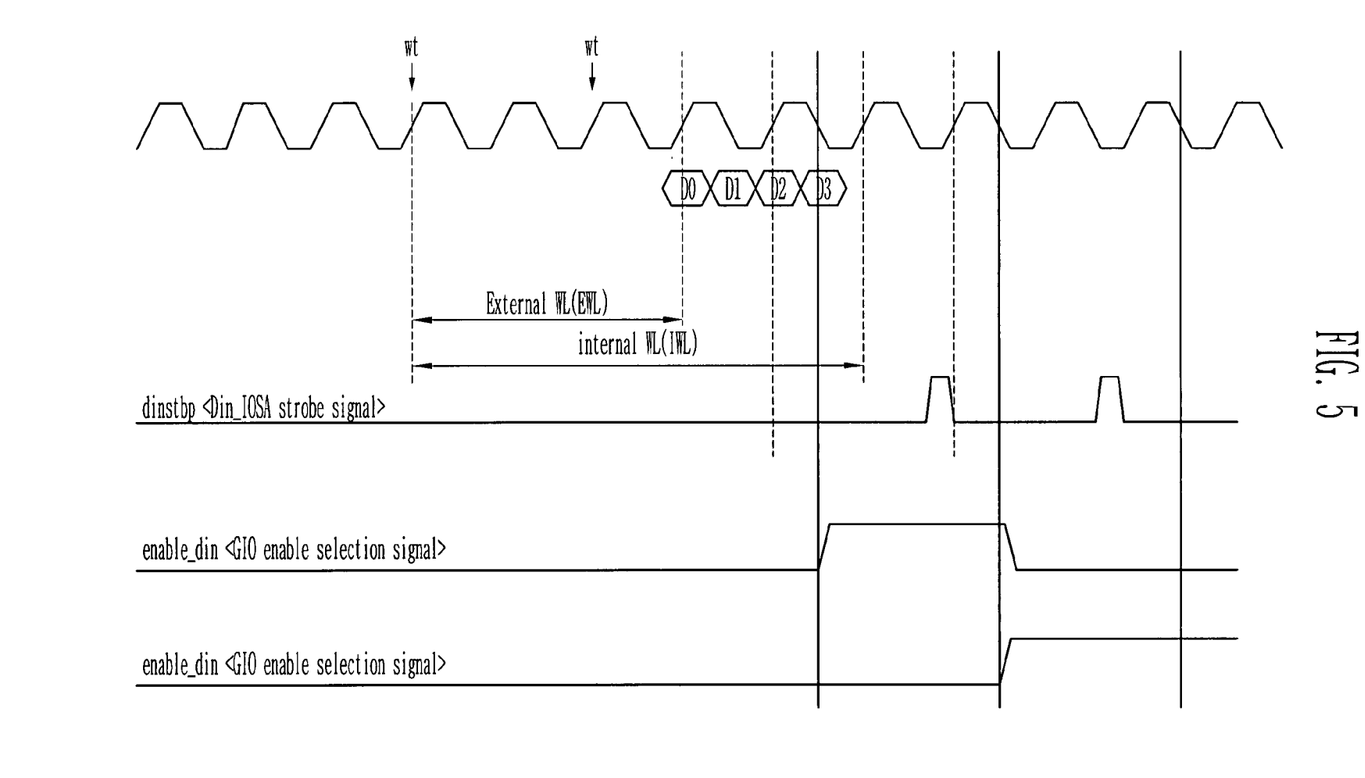
FIG. 5 is an exemplary timing chart.

For a timing margin or a limitation of tCK, a control signal enable_din<0:3> should be generated to safely wrap up the control signal dinstbp. For this purpose, the enable timing of the F<0:3> should be fixed to "internal write latency—0.5tCK" as shown in FIG. 5. This is can be accomplished by loading the information of the bank address and the information that the write operation has been performed on the signal, which is activated at the time of "internal write latency—0.5tCK." In case of an x4 mode, the column address y_add<11> needs to arrive in advance of this signal F<0:3>, which can be accomplished by latching and outputting of the address buffer at the time of "internal write latency—1tCK".

The timing chart in FIG. 5 shows the case that a burst length is set to 4 and the write command is input in a gapless manner.

The enable timing of the control signal enable_din that is generated by a combination of the X4 and X8 mode coding signals xa13_wt and ya11_wt becomes "internal write latency—0.5tCK," and the disable timing of the control signal enable_din becomes "internal write latency—1.5tCK." This is because a 4-bit pre-fetch is used in a DDR II, and thus each packet is composed of 4 bits. Therefore, an interrupt operation is not assisted at BL=4. In other words, this means 4 bits are always maintained. For this reason, at least 2tCK can be maintained for the control signal enable_din (i.e., if burst length=4 in a gapless operation, or if burst length=8 in an interrupt operation, 2tCK can be maintained). The control signal dinstbp, which is a strobe signal of the data input/output sense amplifier, is activated at the time of internal write latency. Thus, the timing margin of this signal is sufficient.

Figure 6A:
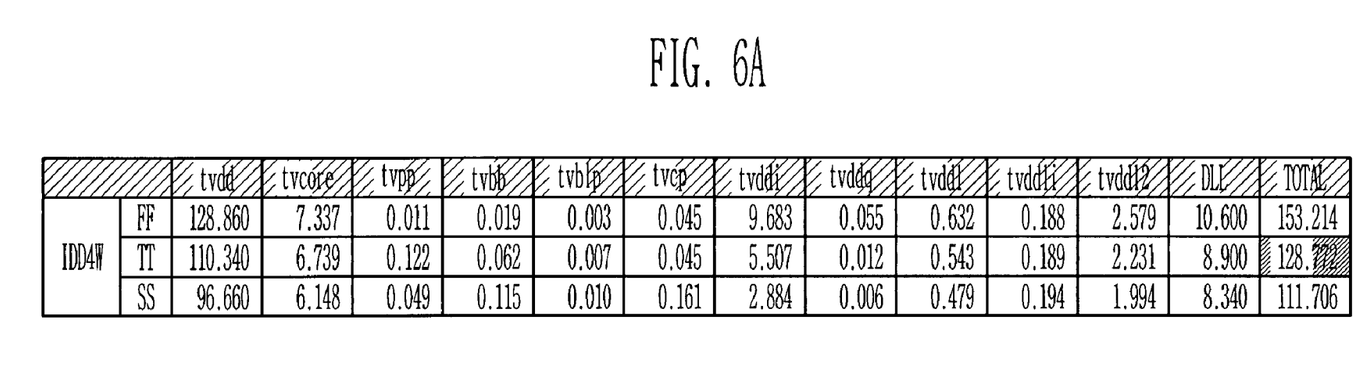
FIGS. 6A and 6B show the results of an IDD4W simulation comparing the disclosed embodiments to the conventional arts.
Figure 6B:
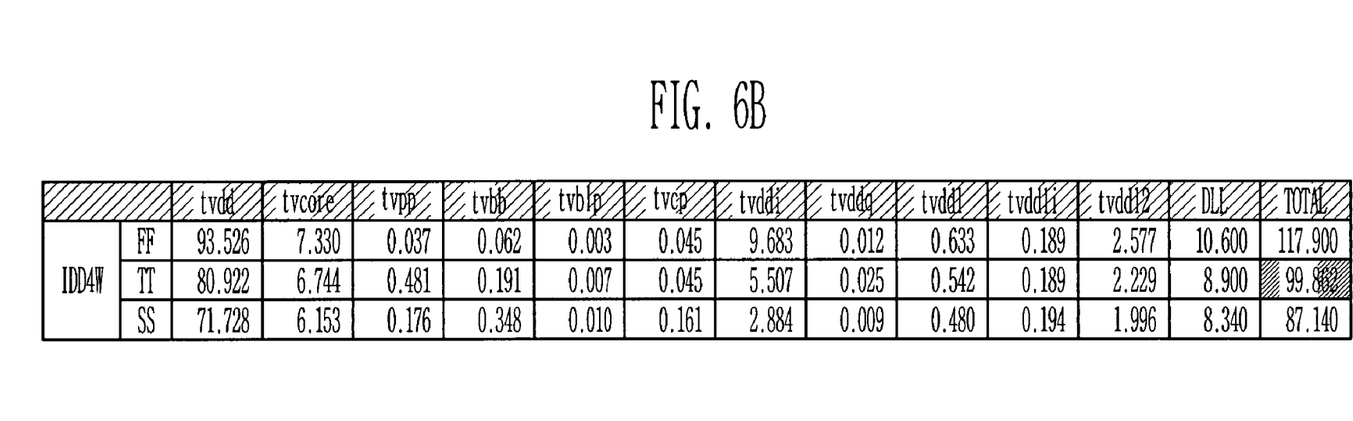

FIG. 6A shows the result of an IDD4W simulation according to the conventional art, while FIG. 6B shows the result according to the disclosed embodiments.

Figure 7:
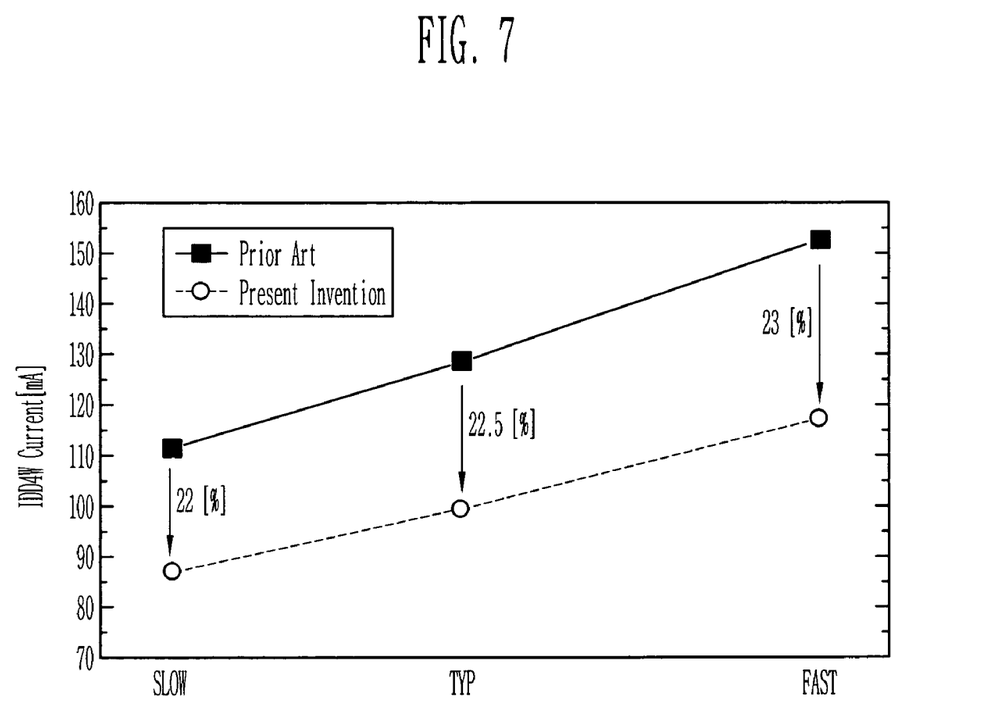
FIG. 7 is a graph for showing effects of the IDD4W reduction.

FIG. 7 is a graph for showing the result of the simulation of the IDD4W currents on the conditions of slow or fast processes, voltages, and temperatures. As described above, the power consumption in a DRAM according to the disclosed embodiments can be reduced by 23% in comparison to the conventional art.

According to the disclosed embodiments it is possible to reduce the power consumption in a DRAM. In addition, because not all global lines, but only 16 or 32 global lines, are toggled in an X4 or X8 mode, it is possible to reduce the defect that its polarity is changed due to the coupling with neighboring global lines.

Although the foregoing description has been made with reference to the preferred embodiments, it is to be understood that changes and modifications of the present invention may be made by those of ordinary skill in the art without departing from the spirit and scope of the present invention and appended claims.

What is claimed is:

1. A write path scheme in a synchronous DRAM, comprising:
    a data converter unit to convert serial input data to parallel output data;
    a multiplexer to output data from the data converter unit depending on a first and a second mode selection signals;
    a data input/output sense amplifier, having a plurality of sense amplifiers, to separately operate the plurality of sense amplifiers depending on the first and the second mode selection signals to sense data from the multiplexer and then load the data on a global input/output line; and
    a write driver to load data from the global input/output line on a local input/output line.

2. The write path scheme in a synchronous DRAM according to claim 1, wherein the data input/output sense amplifier further comprises a plurality of enable circuits to separately operate the plurality of sense amplifiers.

3. The write path scheme in a synchronous DRAM according to claim 2, wherein each of the plurality of enable circuits comprises:
    a first coding unit to code a particular row address;
    a second coding unit to code a particular column address;
    a third coding unit to code an output of the first coding unit and an output of the second coding unit depending on the first and the second mode selection signals; and
    a control circuit to control a signal subjected to a domain crossing depending on an output of the third coding unit to create a control signal to separately operate the plurality of sense amplifiers.

4. The write path scheme in a synchronous DRAM according to claim 3, wherein the first coding unit is adapted to perform the coding for the particular row address depending on:
    a first control signal obtained by a combination of a bank address and an active signal which is activated when a memory bank active operation is performed;
    a second control signal obtained by a combination of a bank address and a signal which is activated when a data write operation is performed;
    a power-up signal;
    the first mode selection signal; and
    the second mode selection signal.

5. The write path scheme in a synchronous DRAM according to claim 3, wherein the second coding unit is adapted to perform the coding for the particular column address depending on:
    a second control signal obtained by a combination of a bank address and a signal which is activated when a data write operation is performed;
    the first mode selection signal; and
    a power-up signal.

6. The write path scheme in a synchronous DRAM according to claim 3, wherein the first coding unit comprises:
    a plurality of transfer gates to transfer the particular row address depending on a first control signal obtained by a combination of a bank address and an active signal which is activated when each memory bank active operation is performed;
    a plurality of latches to latch the particular row address which has passed through each of the transfer gates;
    a plurality of inverters to invert each of the outputs of the latches;
    a plurality of transfer gates to transfer each of the outputs of the latches to a single node depending on a second control signal obtained by a combination of a bank address and a signal which is activated when a data write operation is performed;
    a latch to latch an output of the node;

an inverter to invert an output of the latch to latch an output of the node;

a NAND gate to combine an output of the inverter with a signal obtained by a combination of the first mode selection signal and the second mode selection signal;

an inverter to invert an output of the NAND gate; and a transistor to set up an initial value on the node depending on a power-up signal.

7. The write path scheme in a synchronous DRAM according to claim 3, wherein the second coding unit comprises:

a plurality of transfer gates to transfer the particular column address to a node depending on a second control signal obtained by a combination of a bank address and a signal which is activated when a data write operation is performed;

a latch to latch an output of the node;

an inverter to invert an output of the latch to latch an output of the node;

a NAND gate to combine the first mode selection signal and an output of the inverter;

an inverter to invert an output of the NAND gate; and a transistor to set up an initial value of the node depending on a power-up signal.

8. The write path scheme in a synchronous DRAM according to claim 7, wherein a latch timing of the particular column address is set to internal write latency—1tCK.

9. The write path scheme in a synchronous DRAM according to claim 3, wherein an enable timing of an output signal of the third coding unit is set to internal write latency—0.5 tCK.

* * * * *